United States Patent
Ruffner et al.

(10) Patent No.: US 8,201,134 B2
(45) Date of Patent: Jun. 12, 2012

(54) METHOD TO AVOID MALCONNECTIONS WITH RESPECT TO VOLTAGE LEVELS OF ELECTRONIC COMPONENTS OF CIRCUIT BOARDS DURING CIRCUIT BOARD DESIGN

(75) Inventors: Horst Ruffner, Stuttgart (DE); Klaus Thumm, Pfalzgrafenweiler (DE)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 12/348,387

(22) Filed: Jan. 5, 2009

(65) Prior Publication Data
US 2009/0177701 A1    Jul. 9, 2009

(30) Foreign Application Priority Data
Jan. 8, 2008   (EP) .................................... 08100182

(51) Int. Cl.
G06F 17/50   (2006.01)
(52) U.S. Cl. ........................................ 716/137
(58) Field of Classification Search .................. 716/137
See application file for complete search history.

(56) References Cited

U.S. PATENT DOCUMENTS

| | | | | |
|---|---|---|---|---|
| 5,754,842 A * | 5/1998 | Minagawa | ...................... | 700/97 |
| 6,243,853 B1 * | 6/2001 | Parker | ........................... | 716/104 |
| 7,114,132 B2 * | 9/2006 | Yaguchi | ....................... | 716/115 |

* cited by examiner

*Primary Examiner* — Jack Chiang
*Assistant Examiner* — Brandon Bowers
(74) *Attorney, Agent, or Firm* — Cantor Colburn LLP; Dennis Jung

(57) ABSTRACT

A method to avoid malconnections with respect to voltage levels of electronic components of a circuit board during circuit board design is described, comprising the steps of:
creation of a Component Specification Library (CSL) comprising at least distinct pinnames and assigned voltage data;
creation of groups of pins of components to be connected with each other on a particular voltage level according to the circuit board design;
verification of the voltage data of the pins of the components within the particular group.

17 Claims, 3 Drawing Sheets

METHOD TO AVOID MALCONNECTIONS WITH RESPECT TO VOLTAGE LEVELS OF ELECTRONIC COMPONENTS OF CIRCUIT BOARDS DURING CIRCUIT BOARD DESIGN

BACKGROUND OF THE INVENTION

The invention relates to circuit board design and to simulation of circuit board behavior during circuit board design.

Complex circuit boards, particularly Printed Circuit Boards (PCB) like e.g. Bladeboards, I/O boards, system control boards, may comprise up to 5000 or more electronic components having different supply voltages. Due to this, on circuit boards multiple supply and signal voltages are wired, wherein up to five to ten different voltage levels are no exception.

An adaptation of different signal voltages is performed or implemented by using level converters. The supply voltages are distributed by powerplanes or by broad PCB tracks typically made of copper. If a wrong connection occurs, components and also boards can be destroyed, malfunctions of the components can occur and breakdowns or early failures can happen.

According to the state of the art, a verification of the proper connection of supply-voltage and signal pins with respect to the required voltages to be applied on said pins is performed manually using circuit diagrams and data sheets of the components. State of the Art checking tools provide verification of logic behavior of components, control of interconnections, impedances and similar electric characteristics but do not provide verification functionality to avoid the abovementioned consequences of wrong connections with respect to voltage levels.

SUMMARY OF THE INVENTION

It is therefore an object of the invention to provide a method to avoid malconnections with respect to voltage levels of electronic components of circuit boards during circuit board design, plus a computer program product that allows to execute said method on a computer.

The object of the invention is met by a method to avoid malconnections with respect to voltage levels of electronic components of circuit boards during circuit board design. Said method comprises the steps of:
- creation of a Component Specification Library (CSL), comprising at least distinct pinnames and assigned voltage data, i.e. at least voltage data of each pin of each component used in Very High Speed Integrated Circuit Hardware Description Language (VHDL) during circuit board design;
- creation of groups of pins of components to be connected with each other on a particular voltage level according to the circuit board design;
- verification of the voltage data of the pins of the components within the particular group.

The method provides to check electrical connections and specification of a circuit board wiring. Said method has the advantage over the state of the art, that it allows shortening of development time by omitting costly manual control procedures. Further, the invention omits wrong connections and thus destruction of components and also boards by malconnections. The invention also omits malfunctions of the components and breakdowns or early failures.

In a preferred embodiment of said invention, the elements of said library comprise voltage levels and assigned tolerance windows, e.g. in form of minimum and maximum voltage levels.

According to a preferred embodiment of the invention, voltage data are collected from vendor datasheets of manufacturers of components and/or Simulation Program with Integrated Circuit Emphasis (SPICE) simulation results and/or Input Output Buffer Information Specification (IBIS) models, in order to create the CSL.

In another preferred embodiment of said invention, each pin of each component is defined with a Physical Pin Name (PPN) like e.g. a Pin Number, e.g. A12, B13, . . . , Y99, and a Logical Pin Name (LPN), e.g. VCC, GND, Reset, Inhibit or the like within the CSL.

In an additional preferred embodiment of said invention, the CSL preferably is stored in a file, e.g. a database file, which is easy to handle and can be stored e.g. on a harddisc of a computer, on a CD or on a DVD.

In a preferred embodiment of said invention, the assigned voltage data are real voltage values, for the supply pins, e.g. in the form of:

$Vcc=5V\pm10\%$, $Vdd=3.3V\pm5\%$, $Vref=1,250V\pm1\%$.

Up to now no real values are assigned anywhere but in vendor datasheets, what is useless in the design process. Further netnames, like e.g. IN, OUT, BIDI for input, output and bidirectional connections are assigned with their signal voltage levels. Thereby the default signal voltage level is supply voltage. Preferably, different signal voltage levels are specified too.

According to another preferred embodiment of the invention components are defined, which can be ignored. Such components are 'passive' components like e.g. resistors, capacitors and the like, typically arranged in series to other components.

In an additional preferred embodiment of said invention the e.g. VHDL design rules are adapted in a way that for all different supply voltages, like e.g. VCC, VDD, Vref and the like, unique names are defined.

In another additional preferred embodiment of said invention the e.g. VHDL design rules are adapted in a way that each name of a component used during VHDL design matches to the name of the particular component in the CSL.

In a particularly preferred embodiment of said invention the e.g. VHDL design rules are adapted in a way that a VHDL designer has to use the PPNs. Up to now, VHDL is using logical names like e.g. Vcc, Vdd, or signal names. According to the state of the art, no real values are assigned to this logical or signal names resulting in misunderstandings and confusion. According to the invention, real values are assigned to LPNs and thus misunderstandings and confusion are avoided.

In a preferred embodiment of said invention, substructures for complex circuitry of passive and active components are defined within the CSL and within the circuit board design, like e.g. for a level converter implemented with a resistive voltage divider.

According to a preferred embodiment of the invention, level converters are handled as normal components with input, output and supply voltages.

A particularly preferred embodiment of said invention is characterized in that the creation of the CSL is performed by providing a database and assigning pinnames with voltage values and inserting said assigned pinnames with voltage values as entries in the database, so that a CSL is created comprising at least distinct pinnames and assigned voltage data, i.e. at least voltage data of each pin of each component used in VHDL during circuit board design.

Another particularly preferred embodiment of said invention is characterized in that the creation of groups of pins of components to be connected with each other on a particular voltage level according to the circuit board design is performed by packaging a circuit board design, creation of a netlist comprising all pins of components connected with each other according to the circuit board design, and grouping the pins to be connected with each other on a particular voltage level. Thereby the netlist created in step 04 is passed through and all components with same supply voltage definition are grouped.

An additional particularly preferred embodiment of said invention is characterized in that the verification of the voltage data of the pins of the components within the particular group is performed by comparing the assigned voltage values of the pins within one group with each other, wherein a verification is performed, if all components within a group match with the component specification in the CSL, including the tolerances also defined in the CSL. Preferably the verification starts from each component's Output Pin collecting all Input Pins, i.e. targets according to the netlist, wherein all electrical parameters for Input-Output connections are checked with the CSL. The same is repeated with bidirectional connections. Thereby preferably serial, simple passive components are ignored.

According to a preferred embodiment of the invention, the method is finished if all pins are verified and all pins match the comparison.

According to another preferred embodiment of the invention, an error is reported if a mismatch is detected, i.e. when a pin within one group does not match with the particular voltage level of the group or in case of a missing power connection or in case of a missing level converter.

According to a particular preferred embodiment of the invention, the method is finished after detection of a mismatch.

In a particularly preferred embodiment of the invention, said method is performed by a computer program product stored on a computer usable medium comprising computer readable program means for causing a computer to perform the method mentioned above, when said computer program product is executed on a computer.

BRIEF DESCRIPTION OF THE DRAWINGS

The foregoing, together with other objects, features, and advantages of this invention can be better appreciated with reference to the following specification, claims and drawings, with:

DETAILED DESCRIPTION

Figure 1:
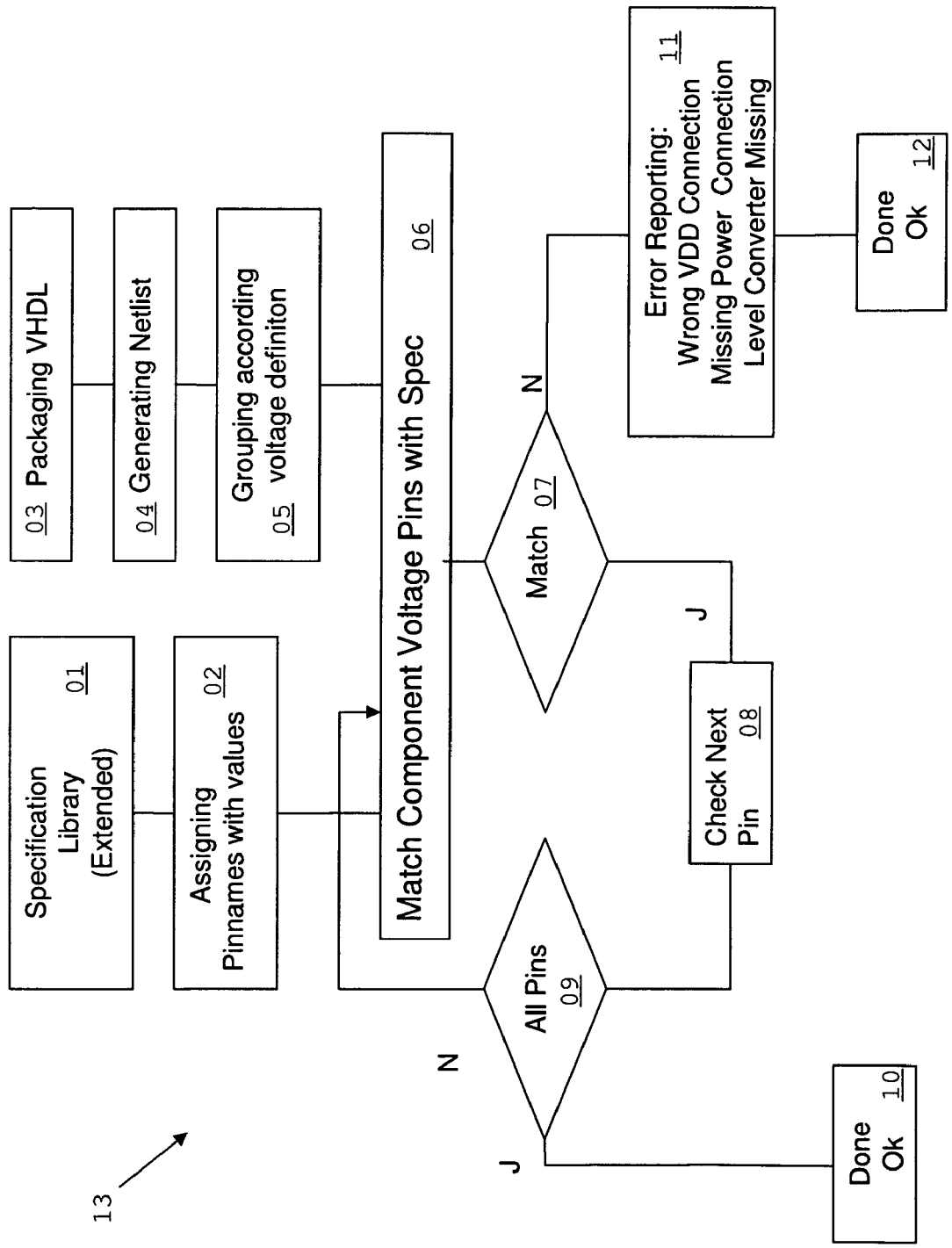
FIG. 1 showing a flowchart of a method according to the invention.

A method to avoid malconnections with respect to voltage levels of electronic components of circuit boards during circuit board design is described. The method uses a library of the active elements of a circuit board, e.g. a PCB.

The library preferably is generated manually. Resistors, capacitors and the like are passive elements, i.e. they do not belong to the active elements and thus are not considered within the library. The elements of said library comprise voltage levels and assigned tolerance windows, e.g. in form of minimum and maximum voltage levels. By using said library, a method is performed to proper connect supply-voltage and signal pins of a PCB automatically with respect to the required voltages to be applied on said pins.

According to the invention a Component Specification Library (CSL) is created comprising at least voltage data of each component preferably used in Very High Speed Integrated Circuit Hardware Description Language (VHDL) during circuit board design. Thereby at least defined voltage levels in form of minimum and a maximum levels or a tolerance windows of all pins and preferably additional properties of each component are defined and comprised in the CSL, like preferably the voltage levels of the pins:

Input;
Output;
Bidirectional (Bidi);
Supply voltage, like e.g. VCC, VDD, Vbias, Vpll, GND and the like.

Depending on the kind of pin, i.e. depending on if the pin is a signal pin or a supply voltage pin, at least the following data are specified within the CSL to each pin of each component:

If the pin is a supply voltage pin, the value of the supply voltage is specified, preferably in the form of a setpoint value, a minimum value and a maximum value.

If the pin is a signal pin and the pin is an input pin, the value of an input signal voltage is specified, preferably in the form of a setpoint value, a minimum value and a maximum value.

If the pin is a signal pin and the pin is an output pin, the value of an output signal voltage is specified, preferably in the form of a setpoint value, a minimum value and a maximum value.

If the pin is a signal pin and the pin is a bidirectional pin, the value of a signal voltage for both directions is specified, preferably in the form of a setpoint value, a minimum value and a maximum value.

The data preferably are collected from e.g. vendor datasheets of manufacturers of components, Simulation Program with Integrated Circuit Emphasis (SPICE) simulation results and Input Output Buffer Information Specification (IBIS) models. In a primitive state, the CSL is empty. In a later state, components are already available in the CSL. If a new component is not comprised in the CSL in a later state, it has to be updated at least with the new components voltage data. Each component used in VHDL is specified in the CSL with a component name. According to the invention, each Pin of each component is defined with a Physical Pin Name (PPN) like e.g. a Pin Number, e.g. A12, B13, . . . , Y99, and a Logical Pin Name (LPN), e.g. VCC, GND, Reset, Inhibit or the like in the CSL. The LPN is used by the logical designer in the VHDL description. According to the state of the art this leads to misunderstanding and confusion and does not allow to automatically validating voltage levels. By the CSL according to the invention, a distinct assignment is provided.

The CSL preferably is a file, e.g. a database file, which is easy to handle and can be stored e.g. on a harddisk of a computer, on a CD or on a DVD.

According to the invention, the names of the pins and the names of the signals are assigned to each other in the CSL. Thereby also real values are assigned for the supply pins, e.g. in the form of:

$Vcc=5V\pm10\%$, $Vdd=3.3V\pm5\%$, $Vref=1,250V\pm1\%$.

Up to now no real values are assigned anywhere but in vendor datasheets, what is useless in the design process. Further netnames, like e.g. IN, OUT, BIDI for input, output and bidirectional connections are assigned with their signal voltage levels. Thereby the default signal voltage level is supply voltage. Preferably different signal voltage levels are specified too.

Preferably also components are defined, which can be ignored. Such components are passive components like e.g. resistors, capacitors and the like, typically arranged in series to other components.

According to the invention, preferably the VHDL design rules are adapted. Thereby it is foreseen that preferably for all different supply voltages, like e.g. VCC, VDD, Vref and the like, unique names are defined. Further preferably a substructure for complex circuitry of passive and active components are defined, like e.g. for a level converter implemented with a resistive voltage divider. Preferably e.g. new level converters are handled as normal components with input, output and supply voltages.

Preferably the VHDL designers must follow the following rules in writing a VHDL description:

Each name of a component used in VHDL design must match to the name of the particular component in the CSL.

The VHDL designers preferably have to use the PPNs, as shown in the following two examples:
  a) Connect component Y123 to Supply Voltage Vcc
  b) Connect signal DATA_BUS<0 . . . 31> to DRAM_DQ<0 . . . 31>. Alternatively it is thinkable that within the CSL an appropriate assignment between LPNs and PPNs is provided.

Figure 3:
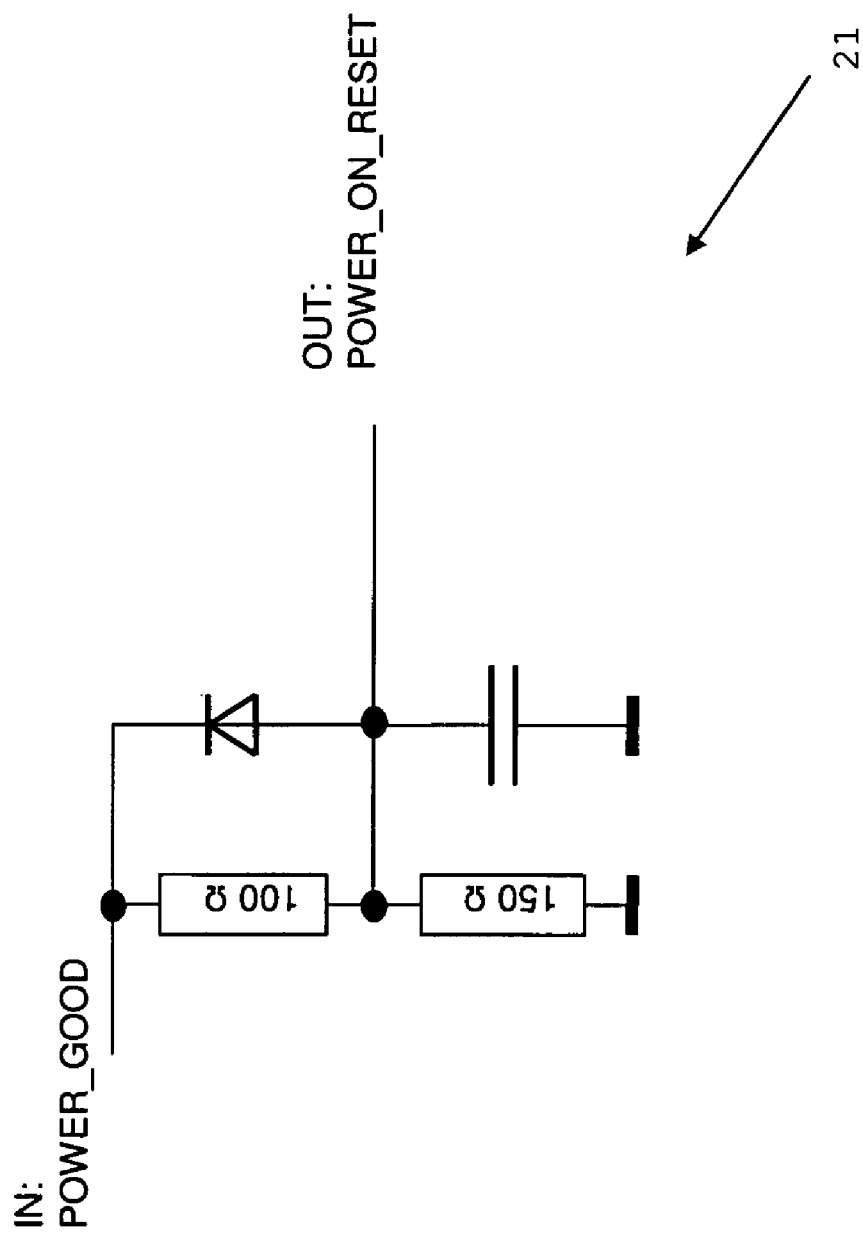
FIG. 3 showing a circuit diagram of a level converter.

Preferably VHDL definitions of special level converters, like e.g. a level converter 21 shown in FIG. 3, with component name and pin definition is foreseen.

Up to now, VHDL is using logical names like e.g. Vcc, Vdd, or signal names. According to the state of the art, no real values are assigned to this logical or signal names. According to the invention, real values are assigned to LPNs. For example real values are assigned to supply voltages in the form of $Vcc=3.3V\pm5\%$. Also real values are assigned to signal names e.g. in the form of IN name=2.5 V±5%, Out name=3.3 V±3%, BIDI Name=1.8V±2%. Also components like resistors and capacitors are defined which are not checked. They will be ignored and not checked.

The checking rules according to the inventions are:
Parse netlist and collect all components with same supply voltage name into groups;
Check if group components supply voltages and tolerances match with defined supply values in CSL;
Check all Source_Target Connections (IN_OUT) to match same voltage requirements;
Check all BIDI connections to match same voltage requirements;
Ignore simple passive elements like e.g. serial resistors, capacitors and the like;
Check collection of discrete components as defined in hierarchical netlist, e.g. level converters.

Provided the above mentioned criteria, a method according to the invention is performed with the following steps with respect to FIG. 1 showing a flowchart 13 of said method:
Step 01: Providing a database.

Step 02: Assigning pinnames with voltage values and inserting said assigned pinnames with voltage values as entries in the database, so that a CSL is created comprising at least distinct pinnames and assigned voltage data, i.e. at least voltage data of each pin of each component used in VHDL during circuit board design.

Step 03: Packaging a circuit board design.

Step 04: Creation of a netlist comprising all pins of components connected with each other according to the circuit board design.

Step 05: Grouping the pins to be connected with each other on a particular voltage level. Thereby the netlist created in step 04 is passed through and all components with same supply voltage definition are grouped.

Steps 06 to 09: Comparing the assigned voltage values of the pins within one group with each other. Thereby verification is performed if all components within a group match with the component specification in the CSL, including the tolerances also defined in the CSL. Preferably the verification starts from each component's Output Pin collecting all Input Pins, i.e. targets according to the netlist, wherein all electrical parameters for Input-Output connections are checked with the CSL. The same is repeated with bidirectional connections. Thereby serial, simple passive components are ignored.

Step 10: If all pins are checked and all pins match the comparison in the steps 06 to 09, the method is finished.

Step 11: Reporting an error if a mismatch is detected, i.e. when a pin within one group does not match with the particular voltage level of the group or in case of a missing power connection or in case of a missing level converter.

Step 12: Finishing the method after detection of a mismatch.

The method provides to check electrical connections and specification of a circuit board wiring.

It is important to mention that the method is equivalent for signal voltages, like e.g. Input, Output and Bidi signals, as well as for supply voltages.

Figure 2:
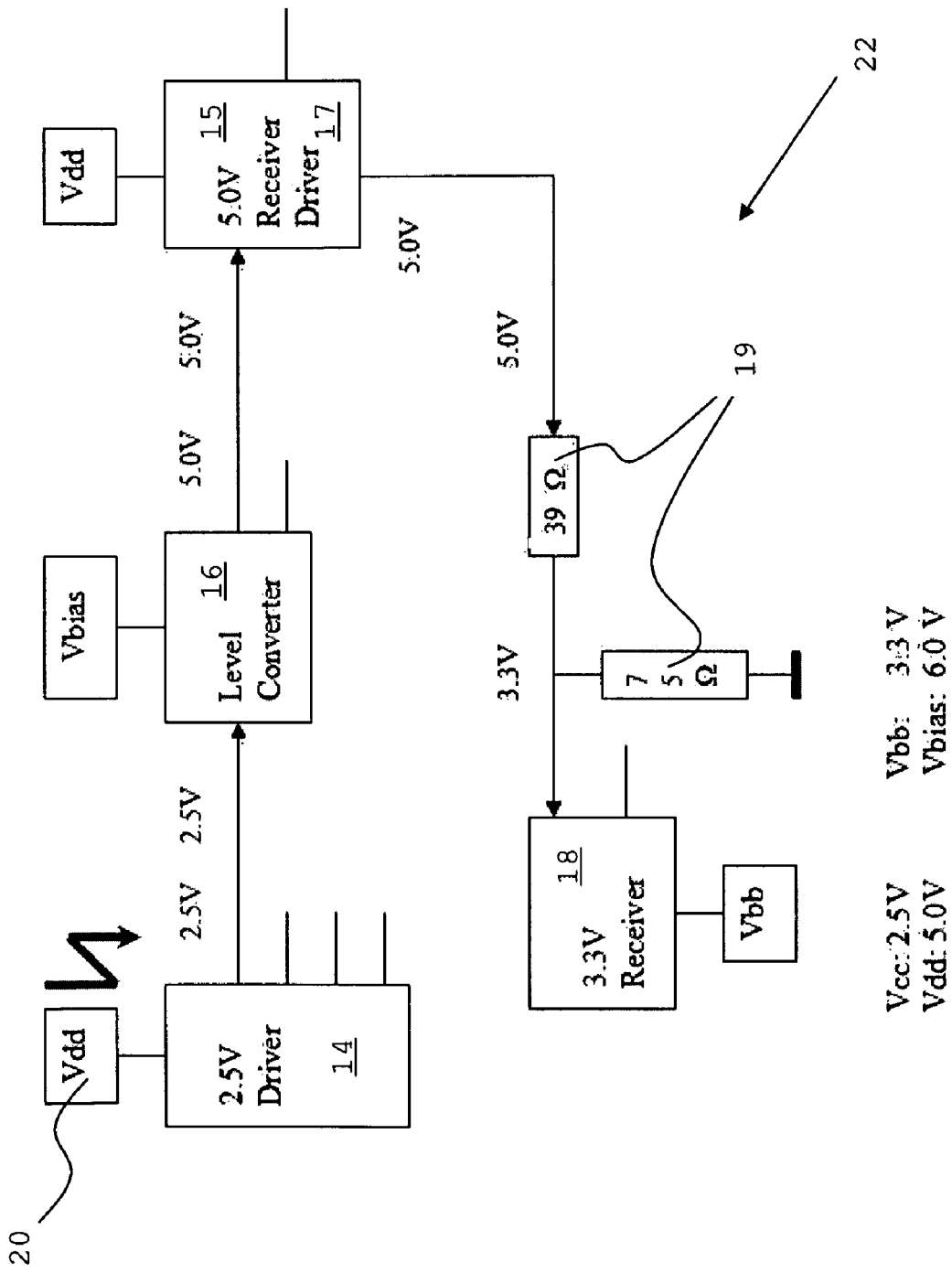
FIG. 2 showing a scheme of a logical signal and power structure.

FIG. 2 shows a scheme of a logical signal and power structure 22 of a circuit board. A 2.5V output driver 14, e.g. a processor I/O pin 14, has to be connected to a 5V receiver 15. The 5V receiver 15 requires a higher input voltage level. Therefore a level converter 16 is required. The method according to the invention allows detecting, if this level converter 16 is missing between these two components 14, 15. Also a 5.0V Output Driver 17, e.g. an external interface 17, has to be connected to a 3.3V Receiver 18. A simple level converter 19 in form of a resistor divider 39Ω/75Ω 19 is one possibility to adjust the voltage level from 5.0V to 3.3V. The method according to the invention allows detecting, if this level converter 19 is not implemented. Further supply voltage Vdd pins 20 of the 2.5V driver component 15 is malconnected to 5.0V instead of to 2.5V. The method according to the invention allows detecting that this power supply connection as incorrect.

The invention has the advantage over the state of the art, that it allows shortening of development time by omitting costly manual control procedures. Further the invention omits wrong connections and thus destruction of components and also boards by malconnections. The invention also omits malfunctions of the components and breakdowns or early failures.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. Method to avoid malconnections with respect to voltage levels of electronic components of a circuit board during circuit board design characterized by the steps of:
    creation of a Component Specification Library (CSL) comprising at least distinct pin names and assigned voltage data, and saving the CSL in a computer database, each pin of each component is associated with a Physical Pin Name (PPN) and a Logical Pin Name (LPN) within the CSL, wherein the LPN identifies a logical function associated with each pin;
    creation of groups of pins of components to be connected with each other on a particular voltage level according to the circuit board design with a computer processor;
    verification of the voltage data of the pins of the components within a particular group with the computer processor the verification of the voltage data of the pins of the components within the particular group is performed by comparing the assigned voltage values of the pins within one group with each other, wherein a verification is performed, if all components within a group match with an associated component specification in the CSL, including the tolerances defined in the CSL; and
    outputting an error report to a user if a voltage level of a first pin within the particular group does not match the particular voltage level of the particular group.

2. Method according to claim 1, characterized in that the elements of said library comprise voltage levels and assigned tolerance windows.

3. Method according to claim 1, characterized in that in order to create the CSL voltage data is collected from vendor datasheets of manufacturers of components and/or Simulation Program with Integrated Circuit Emphasis (SPICE) simulation results and/or Input Output Buffer Information Specification (IBIS) models.

4. Method according to claim 1, characterized in that the CSL preferably is stored in a file.

5. Method according to claim 1, characterized in that the assigned voltage data are real voltage values.

6. Method according to claim 1, characterized in that components are defined, which can be ignored.

7. Method according to claim 1, characterized in that design rules are adapted such that for all different supply voltages, unique names are defined.

8. Method according to claim 1, characterized in that design rules are adapted in a way that each name of a component used during design matches to the name of the particular component in the CSL.

9. Method according to claim 1, characterized in that design rules are adapted in a way that the PPNs are used.

10. Method according to claim 1, characterized in that within the CSL and within the circuit board design substructures for complex circuitry of passive and active components are defined.

11. Method according to claim 1, characterized in that level converters are handled as normal components with input, output and supply voltages.

12. Method according to claim 1, characterized in that the creation of the CSL is performed by providing a database and assigning pinnames with voltage values and inserting said assigned pinnames with voltage values as entries in the database.

13. Method according to claim 1, characterized in that the creation of groups of pins of components to be connected with each other on a particular voltage level according to the circuit board design is performed by packaging a circuit board design, creation of a netlist comprising all pins of components connected with each other according to the circuit board design, and grouping the pins to be connected with each other on a particular voltage level.

14. Method according to claim 1, characterized in that if all pins are verified and all pins match the comparison, the method is finished.

15. Method according to claim 1, characterized in that if a mismatch is detected an error is reported.

16. Method according to claim 15, characterized in that the method is finished after detection of a mismatch.

17. A computer program product stored on a non-transitory computer usable medium comprising computer readable program means for causing a computer to perform the method of claim 1, when said computer program product is executed on a computer.

* * * * *